(12) United States Patent
Huang et al.

(10) Patent No.: US 11,985,842 B2
(45) Date of Patent: May 14, 2024

(54) DISPLAY SUBSTRATE WITH DISPLAY AREA HAVING DIFFERENT PIXEL DENSITY REGIONS, METHOD OF MANUFACTURING THE SAME, AND ELECTRONIC APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Weiyun Huang, Beijing (CN); Wei Zhang, Beijing (CN); Jianchang Cai, Beijing (CN); Longhui Xue, Beijing (CN); Xingliang Xiao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 506 days.

(21) Appl. No.: 17/285,590

(22) PCT Filed: Sep. 10, 2020

(86) PCT No.: PCT/CN2020/114546
§ 371 (c)(1),
(2) Date: Apr. 15, 2021

(87) PCT Pub. No.: WO2021/093439
PCT Pub. Date: May 20, 2021

(65) Prior Publication Data
US 2022/0020953 A1    Jan. 20, 2022

(30) Foreign Application Priority Data
Nov. 15, 2019  (CN) .......................... 201911122240.8

(51) Int. Cl.
  *H10K 50/828*  (2023.01)
  *H10K 59/65*   (2023.01)
  *H10K 71/00*   (2023.01)
(52) U.S. Cl.
  CPC .......... *H10K 50/828* (2023.02); *H10K 59/65* (2023.02); *H10K 71/00* (2023.02)
(58) Field of Classification Search
  CPC ....... H10K 50/828; H10K 59/65; H10K 71/00
  See application file for complete search history.

(56) References Cited

U.S. PATENT DOCUMENTS

2018/0129328 A1* 5/2018 Park ...................... G01S 7/4814
2019/0196635 A1* 6/2019 Park .......................... G06F 3/14
(Continued)

FOREIGN PATENT DOCUMENTS

CN          109256493 A    1/2019
CN          109786582 A    5/2019
(Continued)

OTHER PUBLICATIONS

Chinese Office Action issued by China Intellectual Property Administration of corresponding Chinese patent application No. of 201911122240.8 dated Aug. 25, 2023.

*Primary Examiner* — Lex H Malsawma
(74) *Attorney, Agent, or Firm* — Dilworth & Barrese, LLP.; Michael J. Musella, Esq.

(57) ABSTRACT

A display substrate and a method manufacturing the same, an electronic apparatus are provided. The display substrate includes a display area including a first display region and a second display region, the first display region having a pixel density higher than that of the second display region, the display area including a base substrate, and a first electrode layer, a light-emitting functional layer, and a second electrode layer sequentially provided on the base substrate, the second electrode layer being on a side of the light-emitting
(Continued)

functional layer away from the base substrate,. The second electrode layer includes a first electrode portion provided in the first display region and a second electrode portion provided in the second display region, the first electrode portion and the second electrode portion are electrically connected with each other, and the second electrode portion has a light transmittance higher than that of the first electrode portion.

17 Claims, 6 Drawing Sheets

(56) References Cited

U.S. PATENT DOCUMENTS

| | | | |
|---|---|---|---|
| 2019/0310724 A1 | 10/2019 | Yazdandoost | |
| 2020/0363894 A1* | 11/2020 | Park | G01S 7/4816 |
| 2021/0327958 A1 | 10/2021 | Li et al. | |

FOREIGN PATENT DOCUMENTS

| | | | | |
|---|---|---|---|---|
| CN | 110061038 A | | 7/2019 | |
| CN | 110148621 A | | 8/2019 | |
| CN | 110189639 A | | 8/2019 | |
| CN | 209487511 U | | 10/2019 | |
| CN | 110729337 A | | 1/2020 | |
| CN | 210379053 U | | 4/2020 | |
| KR | 20170024182 A | * | 3/2017 | H01L 51/5278 |

* cited by examiner

DISPLAY SUBSTRATE WITH DISPLAY AREA HAVING DIFFERENT PIXEL DENSITY REGIONS, METHOD OF MANUFACTURING THE SAME, AND ELECTRONIC APPARATUS

The present application claims the priority to the Chinese patent application No. 201911122240.8, filed on Nov. 15, 2019, the entire disclosure of which is incorporated herein by reference as part of the disclosure of this application.

TECHNICAL FIELD

Embodiments of the present disclosure relate to a display substrate and a method of manufacturing the same, and an electronic apparatus.

BACKGROUND

In the display field, organic light-emitting diode (OLED) display panels have characteristics of self-luminescence, high contrast, low energy consumption, wide viewing angle, fast response speed, being applicable for flexible panels, wide range of operating temperature, and being simple to manufacture, and thus have broad development prospects. In order to enrich functions of the display panels, components having other functions, for example, imaging elements having photosensitive functions, are usually integrated in the display panels to realize functions, such as camera and fingerprint recognition functions.

SUMMARY

At least some embodiments of the present disclosure provide a display substrate, comprising a display area, the display area comprising a first display region and a second display region, the first display region having a pixel density higher than that of the second display region, the display area comprising a base substrate, and a first electrode layer, a light-emitting functional layer, and a second electrode layer sequentially provided on the base substrate, the second electrode layer being provided on a side of the light-emitting functional layer away from the base substrate, and the first electrode layer and the second electrode layer being configured to apply a voltage to the light-emitting functional layer to enable the light-emitting functional layer to emit light. The second electrode layer comprises a first electrode portion provided in the first display region and a second electrode portion provided in the second display region, the first electrode portion and the second electrode portion are electrically connected with each other, and the second electrode portion has a light transmittance higher than that of the first electrode portion.

In some examples, the first electrode portion has a thickness greater than that of the second electrode portion in a direction perpendicular to the base substrate.

In some examples, the first electrode portion comprises a first sub-layer and a second sub-layer sequentially stacked on the light-emitting functional layer, and the first sub-layer is provided near the light-emitting functional layer, and the first sub-layer or the second sub-layer is an integral structure with the second electrode portion.

In some examples, the first sub-layer and the second sub-layer are made of a same material.

In some examples, the first sub-layer and the second electrode portion are of an integral structure and made of metal or metal alloy.

In some examples, the first sub-layer and the second sub-layer are made of different materials, and the material of the first sub-layer has a work function lower than that of the material of the second sub-layer.

In some examples, the first sub-layer comprises metal material or metal alloy material, and the second sub-layer comprises transparent conductive material, and the second sub-layer and the second electrode portion are of an integral structure.

In some examples, the first electrode portion and the second electrode portion are integral structures, respectively, and an interface is provided between the first electrode portion and the second electrode portion, and the first electrode portion and the second electrode portion are made of different materials.

In some examples, the first electrode portion and the second electrode portion have a same thickness.

In some examples, the first electrode portion comprises metal material or metal alloy material, and the second electrode portion comprises transparent conductive material.

In some examples, the second electrode layer further comprises a third electrode portion between the first electrode portion and the second electrode portion, the third electrode portion is electrically connected with the first electrode portion and the second electrode portion, respectively, and the third electrode portion has a non-uniform thickness.

In some examples, the thickness of the third electrode portion gradually decreases along a direction from the first display region to the second display region.

In some examples, the thickness of the third electrode portion decreases at first and then increases along a direction from the first display region to the second display region.

At least some embodiments of the present disclosure also provide an electronic apparatus, comprising the display substrate and an imaging element. The imaging element is provided in the second display region and is provided on a side of the second electrode layer near the base substrate, and the imaging element comprises a photosensitive face facing the second electrode layer.

At least some embodiments of the present disclosure also provide a method of manufacturing a display substrate, comprising: forming a display area on a base substrate, the display area comprising a first display region and a second display region, the first display region having a pixel density higher than that of the second display region. Forming the display area comprises: sequentially forming a first electrode layer, a light-emitting functional layer, and a second electrode layer on the base substrate, the first electrode layer and the second electrode layer being configured to apply a voltage to the light-emitting functional layer to enable the light-emitting functional layer to emit light. The second electrode layer comprises a first electrode portion provided in the first display region and a second electrode portion provided in the second display region, the first electrode portion and the second electrode portion are electrically connected with each other, and the second electrode portion has a light transmittance higher than that of the first electrode portion.

In some examples, the first electrode portion comprises a first sub-layer and a second sub-layer sequentially stacked on the light-emitting functional layer, and the first sub-layer is formed near the light-emitting functional layer; forming the second electrode layer comprises: using a first mask to form the first sub-layer in the first display region and to form the second electrode portion in the second display region, using a second mask to form the second sub-layer in the first display region.

In some examples, the first electrode portion comprises a first sub-layer and a second sub-layer sequentially stacked on the light-emitting functional layer, and the first sub-layer is formed near the light-emitting functional layer; forming the second electrode layer comprises: using a first mask to form the first sub-layer in the first display region, and using a second mask to form the second sub-layer in the first display region and to form the second electrode portion in the second display region.

BRIEF DESCRIPTION OF THE DRAWINGS

In order to clearly illustrate the technical solution of the embodiments of the present disclosure, the drawings of the embodiments and relevant technical description will be briefly described in the following. It is apparent that the described drawings in the following are only related to some embodiments of the present disclosure and are not limitative of the present disclosure.

DETAILED DESCRIPTION

Figure 1:
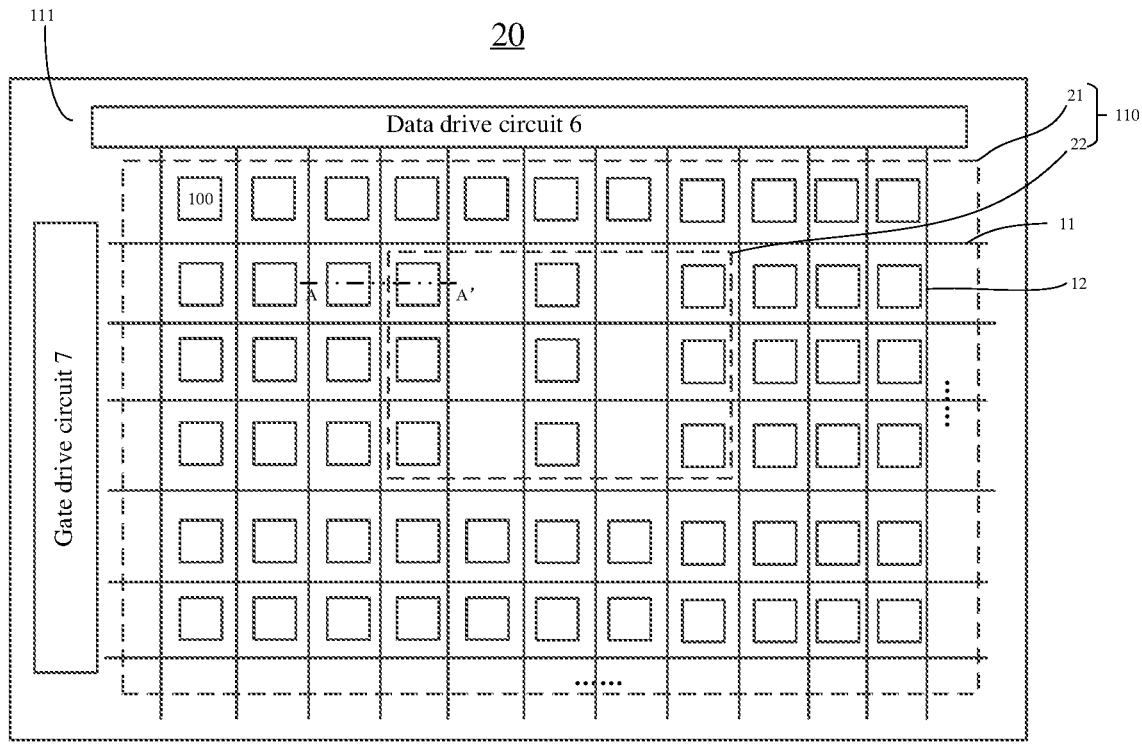
FIG. 1 is a schematic plan view of a display substrate provided by embodiments of the present disclosure.

To make the objective, technical schemes, and advantages of the embodiments of the present disclosure clearer, technical schemes of the embodiments will be described in a clearly and fully understandable way in connection with the drawings related to the embodiments of the disclosure. Apparently, the described embodiments are just a part but not all of the embodiments of the disclosure. Based on the described embodiments herein, one of ordinary skill in the art can obtain other embodiment(s), without any creative labor, which shall be within the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," or the like, are not limited to a physical connection or mechanical connection, but may include an electrical connection/coupling, directly or indirectly. The terms, "on," "under," "left," "right," or the like are only used to indicate relative position relationship, and when the absolute position of the object which is described is changed, the relative position relationship may be changed accordingly.

In a display apparatus integrated with an imaging element, the imaging element is provided in a display area of the display apparatus so as to facilitate a narrow bezel display. However, since display devices are provided in the display area, light transmittance of the imaging element will be affected. For example, light-emitting elements and opaque wiring traces in the sub-pixels may block the light taken by the imaging element and affect the imaging quality. For example, the light transmittance of the area where the imaging element is provided can be improved by reducing the density of the sub-pixels in the area.

At least some embodiments of the present disclosure provide a display substrate comprising a display area which comprises a first display region and a second display region. The pixel density of the first display region is higher than that of the second display region. The display area includes a base substrate, and a first electrode layer, a light-emitting functional layer, and a second electrode layer sequentially disposed on the base substrate. The second electrode layer is located on a side of the light-emitting functional layer away from the base substrate. The first electrode layer and the second electrode layer are configured to apply a voltage to the light-emitting functional layer to enable the light-emitting functional layer to emit light. The second electrode layer comprises a first electrode portion located in the first display region and a second electrode portion located in the second display region. The first electrode portion and the second electrode portion are electrically connected to each other. The second electrode portion has a light transmittance higher than that of the first electrode portion.

By increasing the light transmittance of a portion of the second electrode layer located in the second display region (a display region with lower pixel density), the light transmittance of the second display region is further improved.

FIG. 1 is a schematic plan view of a display substrate provided by embodiments of the disclosure. As illustrated in FIG. 1, the display substrate 20 includes a plurality of gate lines 11 and a plurality of data lines 12. The plurality of gate lines 11 and the plurality of data lines 12 intersect with each other to define a plurality of sub-pixel regions arranged in an array in the display area 110. Each of the sub-pixel regions is provided with one sub-pixel 100. Each sub-pixel includes a light-emitting element and a driving circuit for driving the light-emitting element to emit light. The driving circuit is for example a conventional pixel circuit. For example, the driving circuit includes a conventional 2T1C (i.e., two transistors and one capacitor) pixel circuit, and an nTmC (n and m are positive integers) pixel circuits, such as 4T2C, 5T1C, 7T1C, and etc. In a different embodiment, the driving circuit can further include a compensation circuit which includes an internal compensation circuit or an external compensation circuit. The compensation circuit may include a transistor, a capacitor, and the like. For example, the driving circuit may further include a reset circuit, a light emission control circuit, a detection circuit, etc. For example, the display substrate may further include a data drive circuit 6 and a gate drive circuit 7 located in a non-display area 111 outside the display area 110. The data drive circuit and the gate drive circuit are connected to the driving circuit of the light-emitting element through the data lines 12 and the gate lines 11, respectively, to provide electrical signals. The data drive circuit is used to provide data signals. The gate drive circuit is used to provide scanning signals, and can be further used to provide various control signals, power signals, and the like.

In some other examples, for example, the display substrate adopts a silicon substrate as the base substrate. Both of the gate drive circuit 6 and the data drive circuit 7 can be integrated on the silicon substrate. In this case, because the silicon-based circuit can achieve relatively high integration and precision, the gate drive circuit 6 and the data drive circuit 7 can also be formed for example in an area corresponding to the display area of the display substrate, instead of being located in the non-display area.

As illustrated in FIG. 1, the display area 110 includes a first display region 21 and a second display region 22. The pixel density (the number of sub-pixels per unit area) in the first display region 21 is higher than the pixel density in the second display region 22. For example, the resolution of the first display region 21 is higher than that of the second display region 22. It is to be noted that the pixel density in the present disclosure refers to the density of sub-pixels that actually exist, other than the density of sub-pixels participating in display. Because the pixel density in the second display region 22 is relatively low, light blocked by wirings and devices in the sub-pixels is reduced, which is beneficial to improve the light transmittance of the second display region 22.

For example, the second display region 22 is located near the center of the display area 110, or may be located near the edges of the display area 110 (such as the upper left corner, the upper right corner, the central area of the upper edge, etc.). For example, the shape of the second display region 22 may be a regular shape, such as a rectangle, a circle, or an ellipse, or an irregular shape, such as a drop shape. For example, the size (the side length or the diameter) of the second display region 22 is 2-8 mm, for example, 4-6 mm.

Figure 2A:
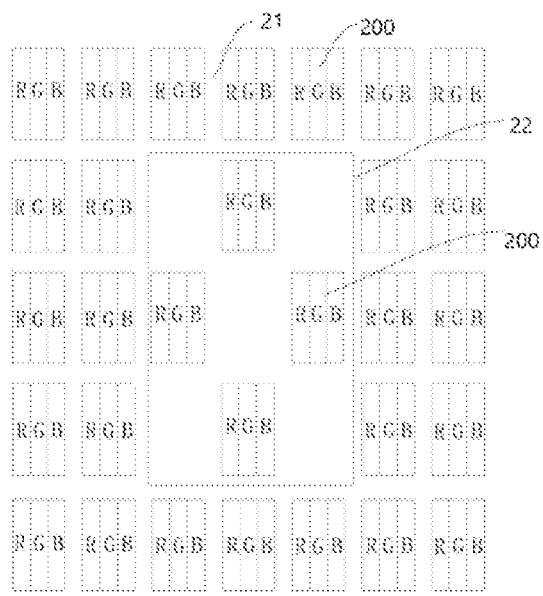
FIG. 2A and FIG. 2B are schematic diagrams of the distribution of sub-pixels of the display substrate provided by embodiments of the present disclosure.
Figure 2B:
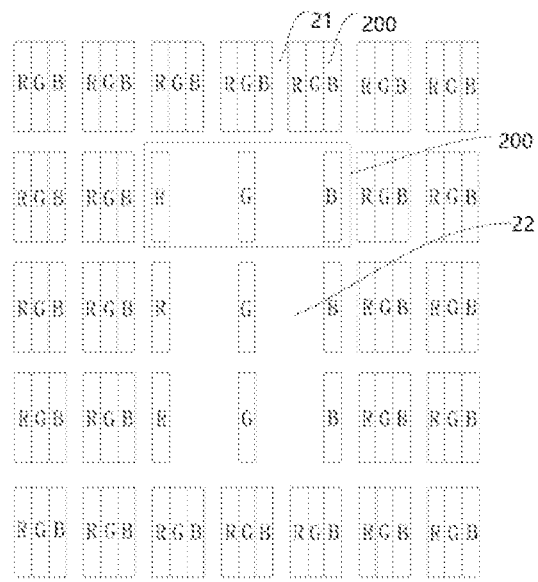

FIGS. 2A and 2B respectively illustrate schematic diagrams of two distributions of the sub-pixels in the embodiments of the present disclosure. For example, three adjacent sub-pixels in the same row form a pixel unit 200, and the three sub-pixels are respectively configured to emit light of three primary colors (R, G, B). However, the embodiments of the present disclosure do not limit the specific structure of the pixel unit. As illustrated in the figure, the distribution density of pixel units in the first display region 21 is higher than the distribution density of pixel units in the second display region 22.

For example, as illustrated in FIG. 2A, the structure of the pixel unit 200 in the second display region 22 is the same as the structure of the pixel unit 200 in the first display region 21. The pitch of the adjacent sub-pixels 100 in the pixel unit 200 in the second display region 22 is the same as that in the first display region 21. Such an arrangement does not change the structure of the pixel unit 200 (minimum repeating unit) in the second display region 22, but only increases the spacing between the pixel units 200, as a result of which the design of the driving circuit is relatively simple.

In some other examples, as illustrated in FIG. 2B, the structure of the pixel unit 200 in the second display region 22 is different from the structure of the pixel unit 200 in the first display region 21. The pitch between the adjacent sub-pixels 100 in the pixel unit 200 in the second display region 22 is greater than the pitch between the adjacent sub-pixels 100 in the pixel unit 200 in the first display region 21.

Figure 3:
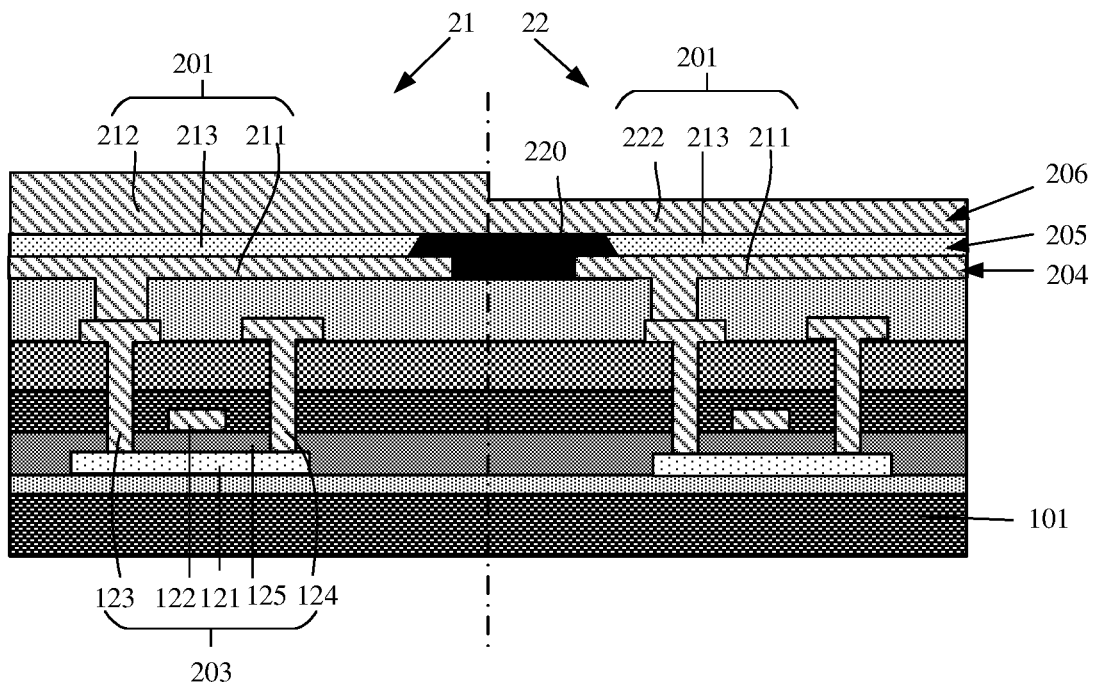
FIG. 3 is a cross-sectional view of the display substrate provided by embodiments of the present disclosure.

FIG. 3 illustrates an example of a cross-sectional view of the display substrate shown in FIG. 1 taken along the A-A' direction. For example, the display substrate is an organic light emitting diode (OLED) display substrate or a micro OLED (Micro OLED) display substrate. The light-emitting element may be an organic light-emitting diode (OLED) or a quantum dot light-emitting diode (QLED), or the like. The embodiments of the present disclosure do not limit the type of the light-emitting element. For example, the light-emitting layer of the OLED may be made of small molecular organic materials or high molecular organic materials.

For the sake of clarity, FIG. 3 schematically illustrates only one sub-pixel 100 in the first display region 21 and only one sub-pixel 100 in the second display region 22. For each of the sub-pixels, only a light-emitting element 201 and a transistor 203 directly connected to the light-emitting element 201 in the driving circuit are shown. For example, the transistor 203 may be a driving transistor which is configured to operate in a saturated state and control the magnitude of the current for driving the light-emitting element 201 to emit light. For example, the transistor 203 may also be a light-emitting control transistor, which is used to control whether the current for driving the light-emitting element 201 to emit light is allowed to flow, or not. The embodiments of the present disclosure do not limit them.

As illustrated in FIG. 3, the first electrode layer 204, the light-emitting functional layer 205, and the second electrode layer 206 are sequentially stacked on a side of the driving circuit away from the base substrate 101. The second electrode layer 206 is located on a side of the light-emitting functional layer 205 away from the base substrate 101. The first electrode layer 204 and the second electrode layer 206 are configured to apply a voltage to the light-emitting functional layer 205 to enable the light-emitting functional layer 205 to emit light. The first electrode layer 204 includes a plurality of first electrodes 211 arranged with spacing and insulated from each other. The plurality of first electrodes 211 are located in the plurality of sub-pixels, respectively, so as to form the light-emitting element 201 in the sub-pixel. The second electrode layer 206 includes second electrodes located in the plurality of sub-pixels, respectively. The plurality of second electrodes are electrically connected to each other. The light-emitting functional layer 205 includes light-emitting functional layer portions 213 respectively located in the plurality of sub-pixels. The first electrode 211, the light-emitting functional layer portion 213, and the second electrode of each sub-pixel 100 form the light-emitting element 201 in the sub-pixel. The light-emitting functional layer portions 213 in the adjacent sub-pixels 100 are spaced apart from each other by a pixel defining layer 220.

For example, the transistor 203 includes an active layer 121, a gate insulating layer 125, a gate electrode 122, a first pole 123 and a second pole 124. The embodiments of the present disclosure do not limit the type, material, and structure of the transistor 203. For example, it may be top-gate type, bottom-gate type, etc. The active layer of the transistor 203 may be made of inorganic semiconductor materials, such as microcrystalline silicon, amorphous silicon, polysilicon (low temperature polysilicon or high-temperature polysilicon), oxide semiconductor (such as IGZO) and the like, or may be organic semiconductor materials, such as PBTTT, PDBT-co-TT, PDQT, PDVT-10, dinaphtho-dithiophene (DNTT) or dinaphno-pentabenzene, etc. For example, the transistor 203 may be N-type or P-type.

For example, the first pole 123 of the transistor 203 is electrically connected with the first electrode 211 of the light-emitting element 201.

It is to be noted that the transistor used in the embodiments of the present disclosure may be a thin film transistor, a field effect transistors, or other switching devices with the same characteristics. In the embodiments of the present disclosure, description is done using the thin film transistor as an example in the description. The source and drain electrodes of the transistor used herein can be symmetrical in structure, and thus the source and drain electrodes of the transistor may have no difference in structure. In the embodiments of the present disclosure, to distinguish the two poles of the transistor other than the gate electrode, for example, one of the poles can be directly referred to as the first pole and the other one of the poles can be referred to as the second pole.

For example, the first electrode layer 204 is configured as an anode layer. The material of the first electrode layer 204 has a high work function. In the case that the light-emitting element 201 has a top emission structure, the material of the first electrode layer 204 also has a high reflectivity. For example, the first electrode layer 204 may include metals, such as magnesium (Mg), lithium (Li), calcium (Ca), strontium (Sr), cesium (Cs), silver (Ag), copper (Cu), aluminum (Al), Molybdenum (Mo), tungsten (W), titanium (Ti), etc., and alloy materials formed by combinations of the above-mentioned metals; or the first electrode layer 204 may include conductive metal oxide materials, such as indium tin oxide (ITO), indium zinc oxide (IZO), zinc oxide (ZnO), zinc aluminum oxide (AZO), etc. For example, the first electrode layer 204 has a stack structure, such as an ITO/Ag/ITO stack structure, or a Ti/Al/Ti/Mo stack structure.

For example, the second electrode layer 206 is configured as a cathode layer. The second electrode layer 206 is made of material having a low work function and a high transmittance. For example, the material of the second electrode layer 206 may be a semi-transmissive metal or metal alloy material, transparent conductive metal oxide material (such as indium tin oxide (ITO), indium zinc oxide (IZO), zinc oxide (ZnO), aluminum zinc oxide (AZO), etc.), transparent nano-electrode material, etc.

For example, to prevent water and oxygen from adversely affecting the cathode made of a low work function metal, a high work function metal and a low work function metal can be used to form the second electrode layer 206 having alloy properties. For example, the second electrode layer 206 is made of alloy materials, such as Ca/Al, Mg/Ag, Gd/Al, Al/Li, Sn/Li, Sn/Al, Ag/Al, etc. For example, the material of the second electrode layer 206 is an Mg/Ag alloy formed by co-evaporating a low work function metal Mg, and a high work function metal Ag with relatively stable chemical properties.

For example, the light-emitting functional layer 205 may include at least one light-emitting layer, and may further include an electron/hole injection layer, an electron/hole transport layer, an electron/hole barrier layer, a charge generation layer, etc., as required. For example, the light-emitting functional layer 205 is a tandem structure, and includes a plurality of light-emitting layers connected in series by a charge generation layer (CGL).

As illustrated in FIG. 3, the second electrode layer 206 includes a first electrode portion 212 located in the first display region 21 and a second electrode portion 222 located in the second display region 22. The first electrode portion 212 and the second electrode portion 222 are electrically connected to each other. The light transmittance of the second electrode portion 222 is higher than the light transmittance of the first electrode portion 212.

For example, by selecting materials or thicknesses of the first electrode portion 212 and the second electrode portion 222, the light transmittance of the second electrode portion 222 can be made higher than the light transmittance of the first electrode portion 212.

For example, in a direction perpendicular to the base substrate 101, the thickness of the first electrode portion 212 is greater than the thickness of the second electrode portion 222. For example, the thickness of the second electrode portion 222 is 60%-95% of the first electrode portion 212. The thickness of the second electrode portion 222 cannot be too small, otherwise the resistance of the second electrode portion 222 would be increased, and it would affect the driving capability of the driving circuit in the second display region 22, which would lead to insufficient light-emitting brightness of the sub-pixels in the second display region 22. For example, the thickness of the first electrode portion 212 is 10 nm-20 nm. The thickness of the second electrode portion 222 is in a range of 6 nm-18 nm, for example, 6 nm-12 nm, or 10 nm-15 nm.

For example, as illustrated in FIG. 3, the first electrode portion 212 and the second electrode portion 222 are integrally formed, namely, they are of an integral structure. Meanwhile, in the direction perpendicular to the base substrate 101, the thickness of the first electrode portion 212 is greater than that of the second electrode portion 222. The "integral structure" in the present disclosure refers to a structure in which a plurality of structures are connected with each other and formed in a same deposition process. In this way, no interface is formed among the plurality of structures, and the plurality of structures have the same material. For example, the integral structure of the second electrode layer 206 can be obtained by forming a conductive layer on the light-emitting functional layer 205 and selectively etching a portion of the conductive layer located in the second display region 22.

For example, the thickness of the first electrode portion 212 may be the same as the thickness of the second electrode portion 222, and the transmittance of the material of the first electrode portion 212 is lower than the transmittance of the material of the second electrode portion 222.

Because the light-emitting functional layer 205 is sensitive to temperature and yellow light process, the second electrode layer 206 can be formed by multiple deposition processes (for example, evaporation process) without using a photolithography process.

Figure 4A:
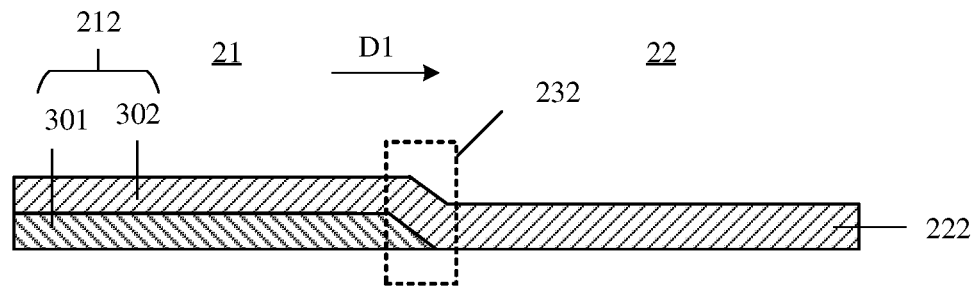
FIGS. 4A-4C are schematic diagrams of the second electrode layer of the display substrate provided by the embodiments of the present disclosure.
Figure 4B:
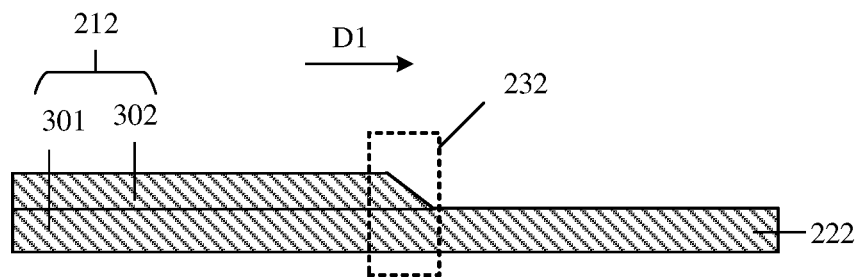
Figure 4C:
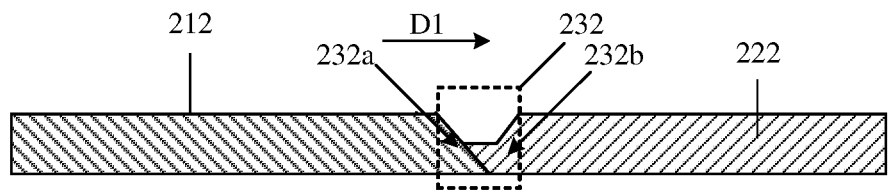

FIGS. 4A-4C illustrate several examples of the second electrode layer provided by the embodiments of the present disclosure.

In some examples, the first electrode portion 212 includes a first sub-layer 301 and a second sub-layer 302 which are sequentially stacked on the light-emitting functional layer 205. The first sub-layer 301 is near the light-emitting functional layer 205. For example, the first sub-layer 301 direct contacts the light-emitting functional layer 205. The first sub-layer 301 or the second sub-layer 302 of the first electrode portion 212 forms an integral structure with the second electrode portion 222.

For example, the material of the first sub-layer 301 is different from that of the second sub-layer 302. The work function of the material of the first sub-layer 301 is lower than the work function of the material of the second sub-layer 302. For example, the material of the first sub-layer 301 includes the above-mentioned metals or metal alloy materials, and the material of the second sub-layer 302 includes the above-mentioned transparent conductive materials, such as indium tin oxide (ITO), indium zinc oxide (IZO), zinc oxide (ZnO), zinc aluminum oxide (AZO), etc. The electron injection capability can be improved by disposing the first sub-layer 301 with a low work function near the light-emitting functional layer 205. In addition, because high work function materials have relatively stable chemical properties, disposing the second sub-layer 302 with a high work function on the outside of the first sub-layer 301 can help to protect the first sub-layer 301 and prevent intrusion of water and oxygen.

For example, the materials of the first sub-layer 301 and the second sub-layer 302 may also be the same, which can simplify the process.

For example, in some examples, as illustrates in FIG. 4A, the second sub-layer 302 of the first electrode portion 212 forms an integral structure with the second electrode portion 222. For example, the second sub-layer 302 of the first electrode portion 212 and the second electrode portion 222 are both made of transparent conductive materials, so that the second display region 22 has a relative high light transmittance.

Because the second sub-layer 302 is made of transparent conductive materials, it can be made thicker to given extent to reduce resistance. For example, the thickness of the second sub-layer is greater than that of the first sub-layer. For example, the thickness of the first sub-layer 301 is 10 nm-20 nm, and the thicknesses of the second electrode portion 222 and the second sub-layer 302 are 50-100 nm. The second sub-layer 302 is overlapped on the first sub-layer 301, which can effectively reduce the resistance of the first electrode portion 212.

For example, in some other examples, as illustrated in FIG. 4B, the first sub-layer 301 of the first electrode portion 212 forms an integral structure with the second electrode portion 222. For example, the materials of the first sub-layer 301 and the second sub-layer 302 are metal or metal alloy materials, such as semi-transmissive metal or metal alloy materials. Because metal or metal alloy materials generally have a relatively low work function, the electron injection capabilities in the first display region and in the second display region can be simultaneously improved by having both of the first sub-layer and the second sub-layer made of metal or metal alloy materials.

For example, the material of the second sub-layer 302 may be metal or metal alloy material, or transparent conductive material.

For example, the thickness of the second electrode portion 222 cannot be too small, otherwise the resistance of the second electrode portion 222 would be increased, and thereby affecting the driving capability of the driving circuit in the second display region 22, which would lead to insufficient light-emitting brightness of the sub-pixels in the second display region.

For example, in the case that both of the first sub-layer 301 and the second sub-layer 302 are made of metals or metal alloys, the thickness of the first sub-layer 301 (i.e., the thickness of the second electrode portion 222) is greater than that of the second sub-layer 302. For example, the thickness of the first sub-layer 301 and the second electrode portion 222 is in a range of 6 nm-18 nm, and the thickness of the second sub-layer 302 is 6 nm-12 nm.

In some other examples, as illustrated in FIG. 4C, the first electrode portion 212 and the second electrode portion 222 are formed separately and made of different materials. The transmittance of the material of the second electrode portion 222 is higher than the transmittance of the material of the first electrode portion 212. Each of the first electrode portion 212 and the second electrode portion 222 is of an integral structure, and an interface is formed between the first electrode portion 212 and the second electrode portion 222. For example, the material of the first electrode portion 212 is the aforementioned metal or metal alloy material, and the material of the second electrode portion 222 is the aforementioned transparent conductive material.

For example, as illustrated in FIG. 4C, the first electrode portion 212 and the second electrode portion 222 have the same thickness, so that an overlapping area of the first electrode portion 212 and the second electrode portion 222 has a relatively flat surface, which reduces a risk of fracture of the second electrode layer.

As illustrated in FIGS. 4A-4C, the second electrode layer 206 further includes a third electrode portion 232 which is located between the first electrode portion 212 and the second electrode portion 222, and the third electrode portion 232 is electrically connected with the first electrode portion 212 and the second electrode portion 212, respectively. The third electrode portion 232 herein is for distinguishing from the main body having a relatively uniform thickness (i.e., the first electrode portion 212 and the second electrode portion 222) of the second electrode layer 206 in the first display region 21 and the second display region 22, respectively. For example, the thickness of the third electrode portion 232 is not uniform, which is caused by the shadow effect during the evaporation process.

As illustrated in FIG. 4C, the third electrode portion 232 includes a first portion 232a and a second portion 232b. The first portion 232a and the first electrode portion 212 are of an integral structure, and the second portion 232b and the second electrode portion 222 are of an integral structure. Due to the shadow effect, the thickness of the first portion 232a gradually decreases along a direction D1 from the first display region 21 to the second display region 22, and the thickness of the second portion 232b gradually increases along the direction D1 from the first display region 21 to the second display region 22. As illustrated in FIG. 4C, the second portion 232b is overlapped on the first portion 232a, and an interface is formed between the first portion 232a and the second portion 232b, and the interface is inclined with respect to the base substrate, that is, an included angle between the interface and the base substrate is an acute angle.

Figure 5:
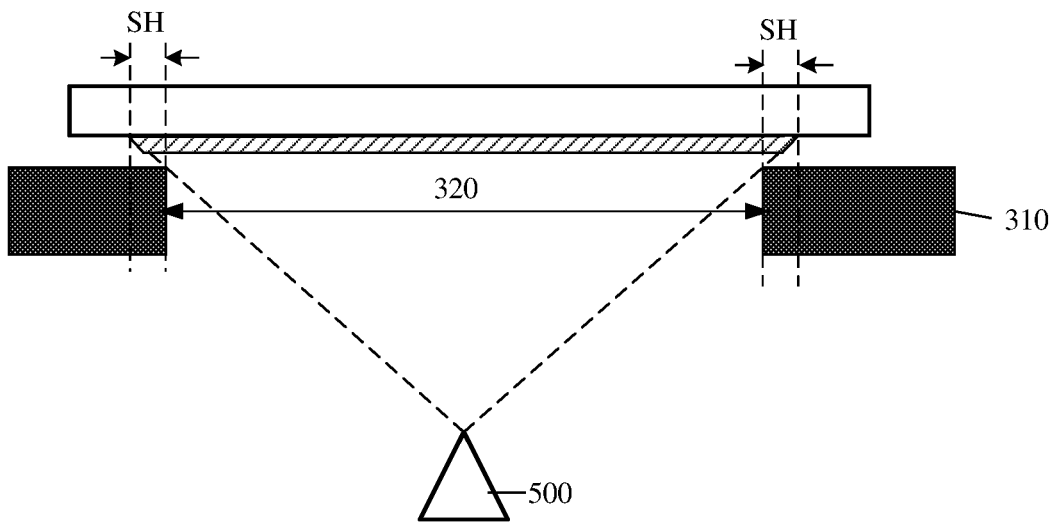
FIG. 5 is a schematic diagram of an evaporation process.

In the case that the thickness of the first electrode portion 212 is the same as the thickness of the second electrode portion 222, the overlapping portion between the first portion 232a and the second portion 232b has a flat surface. For example, the surface is parallel to the surface of the base substrate and is recessed with respect to the surface of the first electrode portion 212 or the surface of the second electrode portion 222. In some other examples, the surface may be flush with the first electrode portion 212 or the second electrode portion 222, and in this case, the third electrode portion 232 has a uniform thickness. FIG. 5 is a schematic diagram of an evaporation process. As illustrated in FIG. 5, evaporation material from the evaporation source 500 will diffuse at an edge of an opening area 320 of a mask 310, as a result of which a film layer actually formed extends beyond the opening area 320 and a shadow region SH is formed outside the edge of the opening area 320. And, the edge of the film layer does not have a right angle, but has a slope. That is to say, in the shadow region, the thickness of the film layer is not uniform, but gradually changes. In a direction away from the main region of the film layer, the thickness of the film layer in the shadow gradually decreases. Due to the shadow effect, the opening area of the mask can be designed to be smaller than the actual film formation area, so that evaporation material can be saved and cost is reduced.

As illustrated in FIGS. 4A and 4B, in the direction D1 from the first display region 21 to the second display region 22, the thickness of the third electrode portion 232 gradually decreases. As illustrated in FIG. 4A, when the first sub-layer 301 of the first electrode portion 212 is formed by evaporation, a shadow region is formed at an edge of the first sub-layer 301 near the second display region 22. As illustrated in FIG. 4B, when the second sub-layer 302 of the first electrode portion 212 is formed by evaporation, a shadow region is formed at an edge of the second sub-layer 302 near the second display region 22.

As illustrated in FIG. 4C, along the direction D1 from the first display region 21 to the second display region 22, the thickness of the third electrode portion 232 decreases at first and then increases. This is because the first electrode portion 212 and the second electrode portion 222 are respectively formed by an evaporation process, and a shadow region is formed at the edge of the first electrode portion 212 near the second display region 22, in this way, the first portion 232a of the third electrode portion 232 is formed; and a shadow region is also formed at the edge of the second electrode portion 222 near the first display region 21, in this way, the second portion 232b of the third electrode portion 232 is formed. The two shadow regions are connected or overlapped with each other to form the third electrode portion 232. In the third electrode portion 232, an interface is formed between the first electrode portion 212 and the second electrode portion 222. A process of forming the third electrode portion 232 will be described in detail hereinafter in the embodiments of the manufacturing method.

Embodiments of the present disclosure also provide an electronic apparatus, including the display substrate 20 and an imaging element. The imaging element is disposed in the second display region 22 of the display substrate 20 and is located on a side of the second electrode layer near the base substrate. The imaging element includes a photosensitive face facing the second electrode layer of the display substrate 20. The imaging element 401 includes a photoelectric sensor configured to receive light that passes through the second electrode layer 206 and reaches the imaging element 401 and converts the light into an electrical signal for forming an image.

Figure 6A:
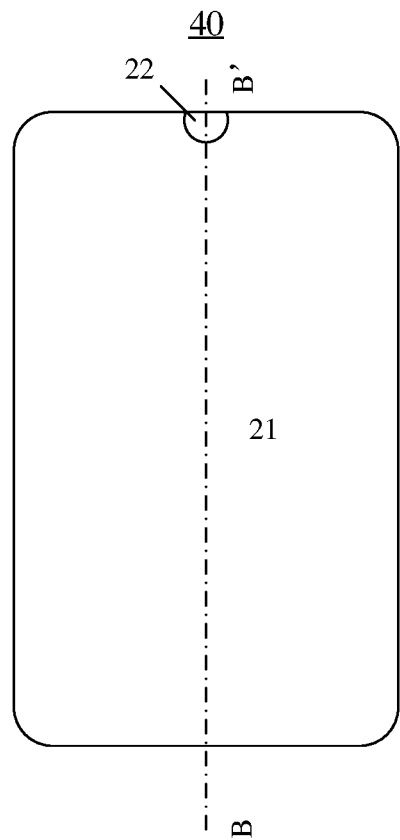
FIG. 6A is a schematic view of an electronic apparatus provided by embodiments of the present disclosure.
Figure 6B:
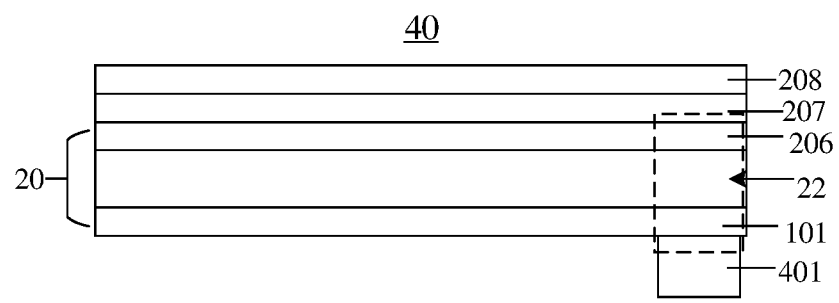
FIG. 6B is a cross-sectional view of the electronic apparatus provided by the embodiments of the present disclosure.

FIG. 6A illustrates a schematically structural view of an electronic apparatus 40 provided by some embodiments of the present disclosure, and FIG. 6B is a cross-sectional view of the electronic apparatus shown in FIG. 6A taken along B-B'. For example, the electronic apparatus 40 further includes an encapsulation layer 207 and a cover plate 208 which are disposed on the display substrate 20. The encapsulation layer 207 is configured to seal the light-emitting element in the display substrate 20 to prevent external moisture and oxygen from entering the light-emitting element and the driving circuit and damaging the devices. For example, the encapsulation layer 207 includes an organic thin film or includes a structure in which an organic thin film and an inorganic thin film are alternately stacked. For example, a water absorption layer (not shown) may be further provided between the encapsulation layer 207 and the display substrate 20, and the water absorption layer is configured to absorb residual water vapor or sol in the previous production process of the light-emitting element. The cover plate 208 is, for example, a glass cover plate. For example, the cover plate 208 may form an integral structure with the encapsulation layer 207.

For example, the imaging element 401 may be affixed to a back surface (a surface opposite to the display surface) of the display substrate 20. As illustrated in FIG. 6B, the imaging element 401 is affixed to a side of the base substrate 101 away from the second electrode layer 206. In some other examples, the imaging element 401 may be formed inside the display substrate 20, for example, on a side of the base substrate 101 near the second electrode layer 206. For example, the imaging element 401 may be formed together with the pixel circuit in the display substrate 20.

In some examples, the imaging element 401 is a camera. In some other examples, the imaging element 401 may be a fingerprint recognition element, which is configured to receive light reflected by a finger and passing through the second electrode layer when the finger approaches or touches the cover plate 208, and convert the light into an electrical signal, and thereby forming a fingerprint image of the finger.

The electronic apparatus can be a product or a component having a display function, such as a digital photo frame, a smart bracelet, a smart watch, a mobile phone, a tablet computer, a display, a laptop, a navigator, and the like.

The embodiments of the present disclosure also provide a method of manufacturing the display substrate. The manufacturing method at least includes: sequentially forming a first electrode layer, a light-emitting functional layer, and a second electrode layer on the base substrate. The second electrode layer includes a first electrode portion located in the first display region and a second electrode portion located in the second display region. The first electrode portion and the second electrode portion are electrically connected to each other. The light transmittance of the second electrode portion is higher than that of the first electrode portion.

Figure 7A:
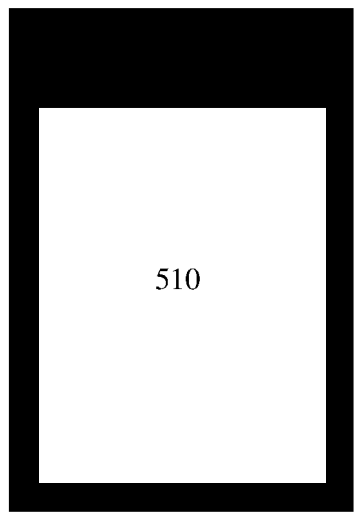
FIGS. 7A-7C are schematic views of the masks used in the method of manufacturing the display substrate provided by embodiments of the present disclosure.
Figure 7A:
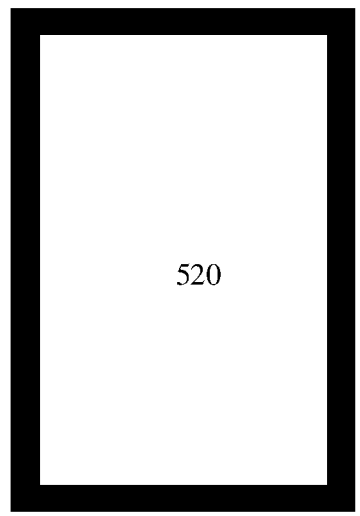
Figure 7B:
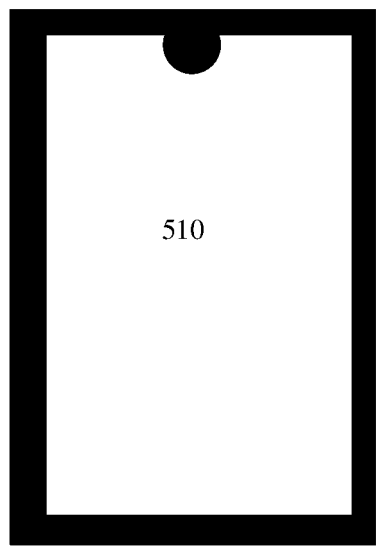
Figure 7B:
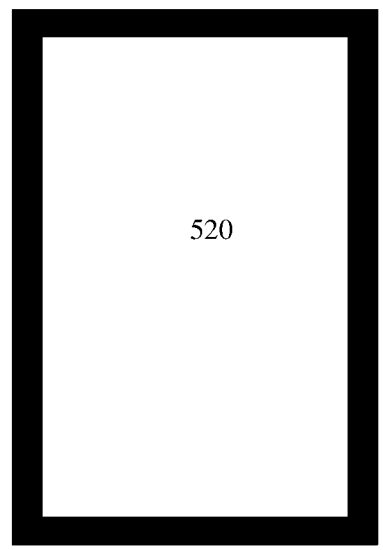
Figure 7C:
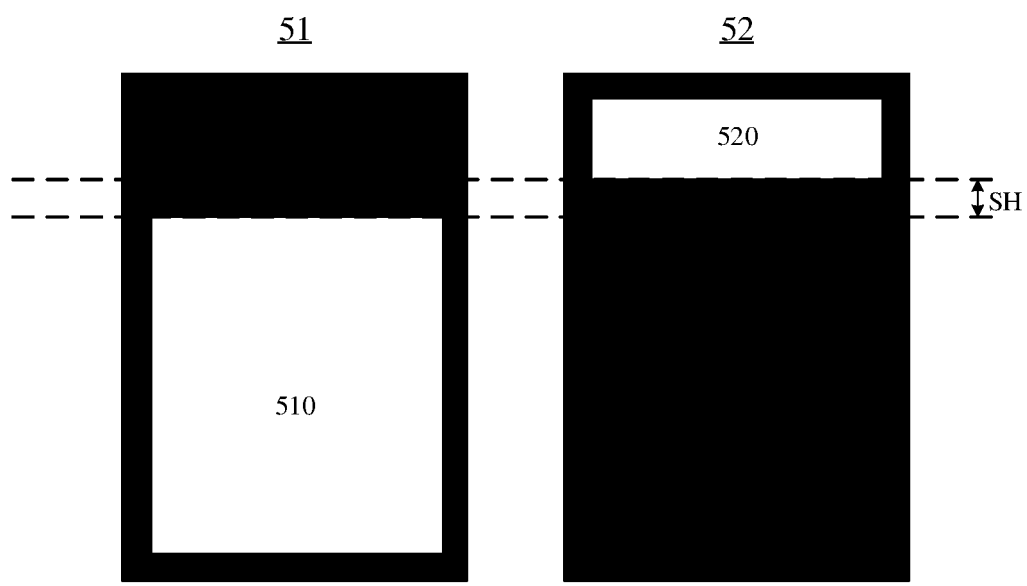

FIGS. 7A-7C illustrate several examples of the masks used in the manufacturing method provided by the embodiments of the present disclosure. The manufacturing method of the display substrate provided by the embodiments of the present disclosure will be exemplarily described hereinafter with reference to FIG. 3, FIGS. 4A-4C, and FIGS. 7A-7C. Referring to FIG. 3, the manufacturing method at least includes the following steps S701-S702.

Step S701: forming a driving circuit of the light-emitting element 201 on the base substrate 101.

For example, as illustrated in FIG. 3, forming the driving circuit includes forming a transistor 203, for example, including sequentially forming an active layer 121, a gate insulating layer 125, a gate electrode 122, an interlayer insulating layer, and source and drain electrode layers (including the first pole 123 and the second pole 124) of the transistor 203 on the base substrate 101.

For example, the material of the active layer 121 may be monoatomic semiconductor material or compound semiconductor material. For example, it may include amorphous silicon, polysilicon (low temperature polysilicon or high temperature polysilicon), metal oxide semiconductor (such as IGZO, AZO), and the like.

For example, the materials of the gate electrode 122 and the source and drain electrode layers include gold (Au), silver (Ag), copper (Cu), aluminum (Al), molybdenum (Mo), magnesium (Mg), tungsten (W), and alloy materials formed by combinations of the above-mentioned metals; or conductive metal oxide materials, such as indium tin oxide (ITO), indium zinc oxide (IZO), zinc oxide (ZnO), zinc aluminum oxide (AZO), etc.

For example, the gate insulating layer 125 and the interlayer insulating layer may each have a single-layer structure of silicon nitride or silicon oxide, or have a multilayer structure formed by stacking silicon nitride and silicon oxide.

For example, the conductive material layer may be formed by a physical vapor deposition process, such as sputtering, and the insulating material layer may be formed by a process, such as chemical vapor deposition.

Step S702: forming a light-emitting element 201 on the driving circuit.

For example, as illustrated in FIG. 3, forming the light-emitting element 201 includes sequentially forming the first electrode layer 204, the light-emitting functional layer 205, and the second electrode layer 206.

For example, a physical vapor deposition (for example, sputtering) process is used to form a first conductive layer, and a patterning process is performed on the first conductive layer to form a plurality of first electrodes 211 spaced apart from each other.

For example, an evaporation process is adopted to sequentially form the light-emitting functional layer 205 and the second electrode layer 206.

In some examples, forming the second electrode layer 206 includes: using a first mask 51 to form the first sub-layer 301 of the first electrode portion 212 in the first display region 21, and using a second mask 52 to form the second sub-layer 302 of the first electrode portion 212 in the first display region 21 and to form the second electrode portion 222 in the second display region 22.

For example, each of the first mask and the second mask may both be an open mask. The open mask has a lower cost than a fine metal mask (FFM), and can avoid limitations on the structure of the display substrate by the precision of the fine metal mask.

FIG. 7A illustrates an example of the first mask 51 and the second mask 52. As illustrated in FIG. 7A, an opening area 510 of the first mask 51 corresponds to the first display region 21. For example, due to the shadow effect, evaporation material spreads out of the area exposed by the opening area 510 at the edge of the opening area 510, and thus the opening area 510 may be smaller than the first display region 21. The opening area 520 of the second mask 52 corresponds to the first display region 21 and the second display region 22.

For example, by using the first mask 51 to form the first sub-layer 301 of the first electrode portion 212 in the first display region 21 at first, and then using the second mask 52 to integrally form the second sub-layer 302 located in the first display region 21 and the second electrode portion 222 located in the second display region 22, the second electrode layer 206 as illustrated in FIG. 4A is formed.

For example, a metal or a metal alloy is used as an evaporation source to form the first sub-layer 301 on the light-emitting functional layer 205, and transparent conductive material is used as an evaporation source to form the second sub-layer 302 and the second electrode portion 222.

For example, by using the second mask 52 to integrally form the first sub-layer 301 located in the first display region 21 and the second electrode portion 222 located in the second display region 22 at first, and then using the first mask 51 to form the second sub-layer 302 in the first display region 21, the second electrode layer 206 as illustrated in FIG. 4B is formed.

For example, a metal or a metal alloy is used as the evaporation source to form the first sub-layer 301 and the second electrode portion 222 on the light-emitting functional layer 206. A metal or a metal alloy is also used as the evaporation source to form the second sub-layer 302, or, transparent conductive material can be used as the evaporation source to form the second sub-layer 302.

For example, the shape of the second display region 22 is a regular shape, such as a rectangle, a circle, etc. Correspondingly, as illustrated in FIG. 7A, the opening area 510 of the first mask 51 is rectangular.

In some other examples, the second display region 22 may have an irregular shape. As illustrated in FIG. 6A, the shape of the second display region 22 is a circle segment (namely, a part of a circle). FIG. 7B illustrates the first mask 51 and the second mask 52 for forming the display substrate.

In some other examples, forming the second electrode layer 206 includes: using a first mask to form the first electrode portion 212 in the first display region 21, and using a second mask to form the second electrode portion 222 in the second display region 22.

FIG. 7C illustrates the first mask 51 and the second mask 52 in the example. As illustrated in FIG. 7C, the opening area 510 of the first mask 51 corresponds to the first display region 21, and the opening area 520 of the second mask 52 corresponds to the second display region 22. Due to the shadow effect, the opening area 510 may be smaller than the first display region 21, and the opening area 520 may be smaller than the second display region 22. For example, the opening area 510 of the first mask 51 overlaps the first electrode portion 212 in a direction perpendicular to the base substrate, and the opening area 520 of the second mask 52 overlaps the second electrode portion 222 in the direction perpendicular to the base substrate. The third electrode portion 232 corresponds to the shadow region SH.

For example, the first electrode portion 212 is firstly formed in the first display region 21 by using the first mask 51, and then the second electrode portion 222 is formed in the second display region 22 by using the second mask 52; or, the second electrode portion 222 is firstly formed in the second display region 22 by using the second mask 52, and then the first electrode portion 212 is formed in the first display region 21 by using the first mask 51. With reference to FIG. 4C, a shadow region SH is formed at the edge of the first electrode portion 212 near the second display region 22, while the first electrode portion 212 is formed. A shadow region SH is formed at the edge of the second electrode portion 222 near the first display region 21, while the second electrode portion 222 is formed. The two shadow regions overlap with each other, so that the first electrode portion 212 and the second electrode portion 222 are electrically connected with each other and the third electrode portion 232 is formed.

For example, a metal or a metal alloy is used as the evaporation source to form the first electrode portion 212 on the light-emitting functional layer 206, and transparent conductive material is used to form the second electrode portion 222 on the light-emitting functional layer 206. That is to say, the third electrode portion 232 includes the metal material and the transparent conductive material.

For example, an encapsulation layer may be further formed on the second electrode layer 206. A polarizing layer may be provided on the second electrode layer 206. A cover plate may be affixed onto the second electrode layer 206.

For example, after the display substrate 20 is prepared, the imaging element 401 is affixed to the back surface (a surface opposite to the display surface) of the display substrate corresponding to the second display region 22, thereby forming the electronic apparatus as illustrated in FIGS. 6A-6B. In some other examples, the imaging element 401 may be formed in the process of forming the driving circuit, the embodiments of the present disclosure do not limit this.

In the accompanying drawings of the embodiments of the present disclosure, the drawings involve only the structure (s) in connection with the embodiment(s) of the present disclosure, and other structure(s) can refer to common design(s). For the sake of clarity, in the drawings used to describe the embodiments of the present disclosure, the thicknesses of layers or regions are enlarged or reduced, that is, these drawings are not drawn according to actual scales. Without conflicting with each other, the embodiments of the present disclosure and the features in the embodiments can be combined with each other to obtain new embodiments.

Although general descriptions and specific implementations have been used in the above to describe the present disclosure in detail, some modifications or improvements can be made on the basis of the embodiments of the present disclosure, which is apparent to those skilled in the art. Therefore, the modifications or improvements made without departing from the spirit of the present disclosure fall within the scope of the present disclosure.

What is claimed is:

1. A display substrate, comprising a display area, the display area comprising a first display region and a second display region, the first display region having a pixel density higher than that of the second display region,
   the display area comprising a base substrate, and a first electrode layer, a light-emitting functional layer, and a second electrode layer sequentially provided on the base substrate, the second electrode layer being provided on a side of the light-emitting functional layer away from the base substrate, and the first electrode layer and the second electrode layer being configured to apply a voltage to the light-emitting functional layer to enable the light-emitting functional layer to emit light,
   wherein the second electrode layer comprises a first electrode portion provided in the first display region and a second electrode portion provided in the second display region, the first electrode portion and the second electrode portion are electrically connected with each other, and the second electrode portion has a light transmittance higher than that of the first electrode portion; and
   the second electrode layer further comprises a third electrode portion between the first electrode portion and the second electrode portion, the third electrode portion is electrically connected with the first electrode portion and the second electrode portion, respectively, and a thickness of the third electrode portion decreases at first and then increases along a direction from the first display region to the second display region.

2. The display substrate according to claim 1, wherein the first electrode portion has a thickness greater than that of the second electrode portion in a direction perpendicular to the base substrate.

3. The display substrate according to claim 2, wherein the first electrode portion comprises a first sub-layer and a second sub-layer sequentially stacked on the light-emitting functional layer, and the first sub-layer is provided near the light-emitting functional layer,
   the first sub-layer or the second sub-layer is an integral structure with the second electrode portion.

4. The display substrate according to claim 3, wherein the first sub-layer and the second sub-layer are made of the same material.

5. The display substrate according to claim 4, wherein the first electrode portion and the second electrode portion are integral structures, respectively, and an interface is provided between the first electrode portion and the second electrode portion, and the first electrode portion and the second electrode portion are made of different materials.

6. The display substrate according to claim 3, wherein the first sub-layer and the second electrode portion are of an integral structure and made of metal or metal alloy.

7. The display substrate according to claim 3, wherein the first sub-layer and the second sub-layer are made of different materials, and the material of the first sub-layer has a work function lower than that of the material of the second sub-layer.

8. The display substrate according to claim 7, wherein the first sub-layer comprises metal material or metal alloy material, and the second sub-layer comprises transparent conductive material, and
   the second sub-layer and the second electrode portion are of an integral structure.

9. The display substrate according to claim 3, wherein the first electrode portion and the second electrode portion are integral structures, respectively, and an interface is provided between the first electrode portion and the second electrode portion, and the first electrode portion and the second electrode portion are made of different materials.

10. The display substrate according to claim 2, wherein the first electrode portion and the second electrode portion are integral structures, respectively, and an interface is provided between the first electrode portion and the second electrode portion, and the first electrode portion and the second electrode portion are made of different materials.

11. The display substrate according to claim 1, wherein the first electrode portion and the second electrode portion are integral structures, respectively, and an interface is provided between the first electrode portion and the second electrode portion, and the first electrode portion and the second electrode portion are made of different materials.

12. The display substrate according to claim 11, wherein the first electrode portion and the second electrode portion have a same thickness.

13. The display substrate according to claim 11, wherein the first electrode portion comprises metal material or metal alloy material, and the second electrode portion comprises transparent conductive material.

14. An electronic apparatus, comprising a display substrate and an imaging element,
   wherein the display substrate comprises a display area, the display area comprising a first display region and a second display region, the first display region having a pixel density higher than that of the second display region, the display area comprising a base substrate, and a first electrode layer, a light-emitting functional layer, and a second electrode layer sequentially provided on the base substrate, the second electrode layer being provided on a side of the light-emitting functional layer away from the base substrate, and the first electrode layer and the second electrode layer being configured to apply a voltage to the light-emitting functional layer to enable the light-emitting functional layer to emit light, the second electrode layer comprises a first electrode portion provided in the first display region and a second electrode portion provided in the second display region, the first electrode portion and the second electrode portion are electrically connected with each other, and the second electrode portion has a light transmittance higher than that of the first electrode portion; and the second electrode layer further comprises a third electrode portion between the first electrode portion and the second electrode portion, the third electrode portion is electrically connected with the first electrode portion and the second electrode portion, respectively, and a thickness of the third electrode portion decreases at first and then increases along a direction from the first display region to the second display region; and wherein the imaging element is provided in the second display region and is provided on a side of the second electrode layer near the base substrate, and the imaging element comprises a photosensitive face facing the second electrode layer.

15. A method of manufacturing a display substrate, comprising:

forming a display area on a base substrate, the display area comprising a first display region and a second display region, the first display region having a pixel density higher than that of the second display region, wherein forming the display area comprises:

sequentially forming a first electrode layer, a light-emitting functional layer, and a second electrode layer on the base substrate, the first electrode layer and the second electrode layer being configured to apply a voltage to the light-emitting functional layer to enable the light-emitting functional layer to emit light, wherein the second electrode layer comprises a first electrode portion provided in the first display region and a second electrode portion provided in the second display region, the first electrode portion and the second electrode portion are electrically connected with each other, and the second electrode portion has a light transmittance higher than that of the first electrode portion; and the second electrode layer further comprises a third electrode portion between the first electrode portion and the second electrode portion, the third electrode portion is electrically connected with the first electrode portion and the second electrode portion, respectively, and a thickness of the third electrode portion decreases at first and then increases along a direction from the first display region to the second display region.

16. The manufacturing method according to claim 15, wherein the first electrode portion comprises a first sub-layer and a second sub-layer sequentially stacked on the light-emitting functional layer, and the first sub-layer is formed near the light-emitting functional layer;

forming the second electrode layer comprises:

using a first mask to form the first sub-layer in the first display region and to form the second electrode portion in the second display region, using a second mask to form the second sub-layer in the first display region.

17. The manufacturing method according to claim 15, wherein the first electrode portion comprises a first sub-layer and a second sub-layer sequentially stacked on the light-emitting functional layer, and the first sub-layer is formed near the light-emitting functional layer;

forming the second electrode layer comprises:

using a first mask to form the first sub-layer in the first display region, using a second mask to form the second sub-layer in the first display region and to form the second electrode portion in the second display region.

* * * * *